(12) United States Patent
Andreev et al.

(10) Patent No.: US 6,519,746 B1
(45) Date of Patent: Feb. 11, 2003

(54) METHOD AND APPARATUS FOR MINIMIZATION OF NET DELAY BY OPTIMAL BUFFER INSERTION

(75) Inventors: Alexander Andreev, San Jose, CA (US); Ranko Scepanovic, San Jose, CA (US); Anatoli Bolotov, Moscow (RU)

(73) Assignee: LSI Logic Corporation, Milpitas, CA (US)

( * ) Notice: Subject to any disclaimer, the term of this patent is extended or adjusted under 35 U.S.C. 154(b) by 111 days.

(21) Appl. No.: 09/685,990

(22) Filed: Oct. 10, 2000

(51) Int. Cl.[7] .................................................. G06F 9/45
(52) U.S. Cl. .................... 716/6; 716/6; 716/5
(58) Field of Search .................... 716/6, 5, 4; 257/208, 257/355; 438/129; 365/201

(56) References Cited

U.S. PATENT DOCUMENTS

| | | | | |
|---|---|---|---|---|
| 5,550,498 A | * | 8/1996 | Kwan et al. ................. 327/175 |
| 5,717,229 A | * | 2/1998 | Zhu ............................ 257/208 |
| 5,849,610 A | * | 12/1998 | Zhu ............................ 257/208 |
| 5,866,924 A | * | 2/1999 | Zhu ............................ 257/208 |
| 5,920,096 A | * | 7/1999 | Lee ............................ 257/355 |
| 6,061,258 A | * | 5/2000 | Tsukikawa ................... 365/201 |
| 6,061,285 A | * | 5/2000 | Tsukikawa ................... 363/17 |

* cited by examiner

*Primary Examiner*—Vuthe Siek
*Assistant Examiner*—Binh Tat
(74) *Attorney, Agent, or Firm*—Mitchell Silberberg & Knupp, LLP

(57) ABSTRACT

The present invention involves a method for reducing delay of a net. The method includes constructing a time-space grid, said time-space grid corresponding to a net, passing a wave through the time-space grid, said wave having a wave value, and inserting a buffer at a point on said time-space grid where insertion of the buffer increases a wave value. The buffer can be a negative buffer or positive buffer. Generally, a second wave is passed through the time-space grid simultaneously with the first wave. Typically, the second wave and the first wave are inverted.

15 Claims, 3 Drawing Sheets

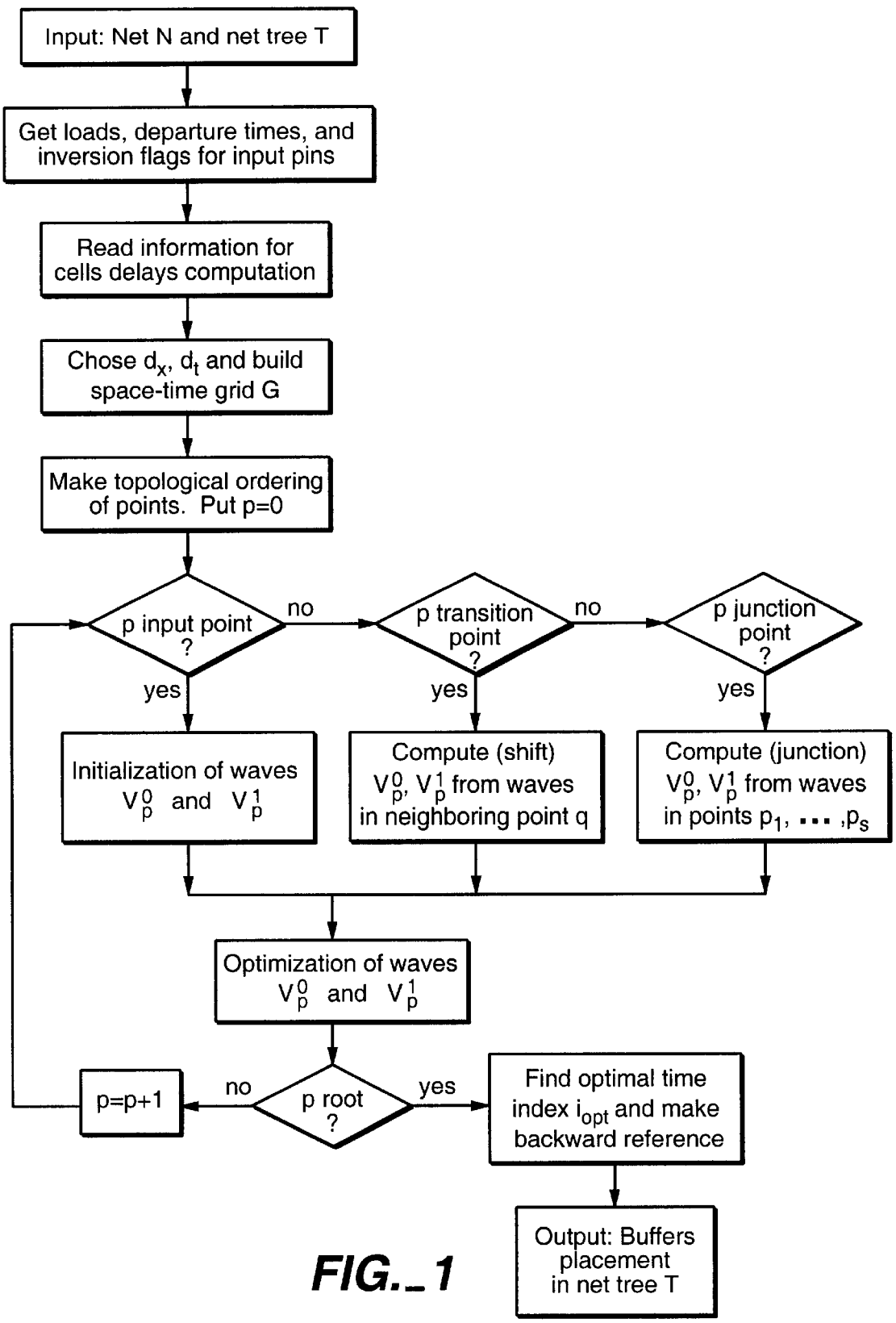
FIG._1

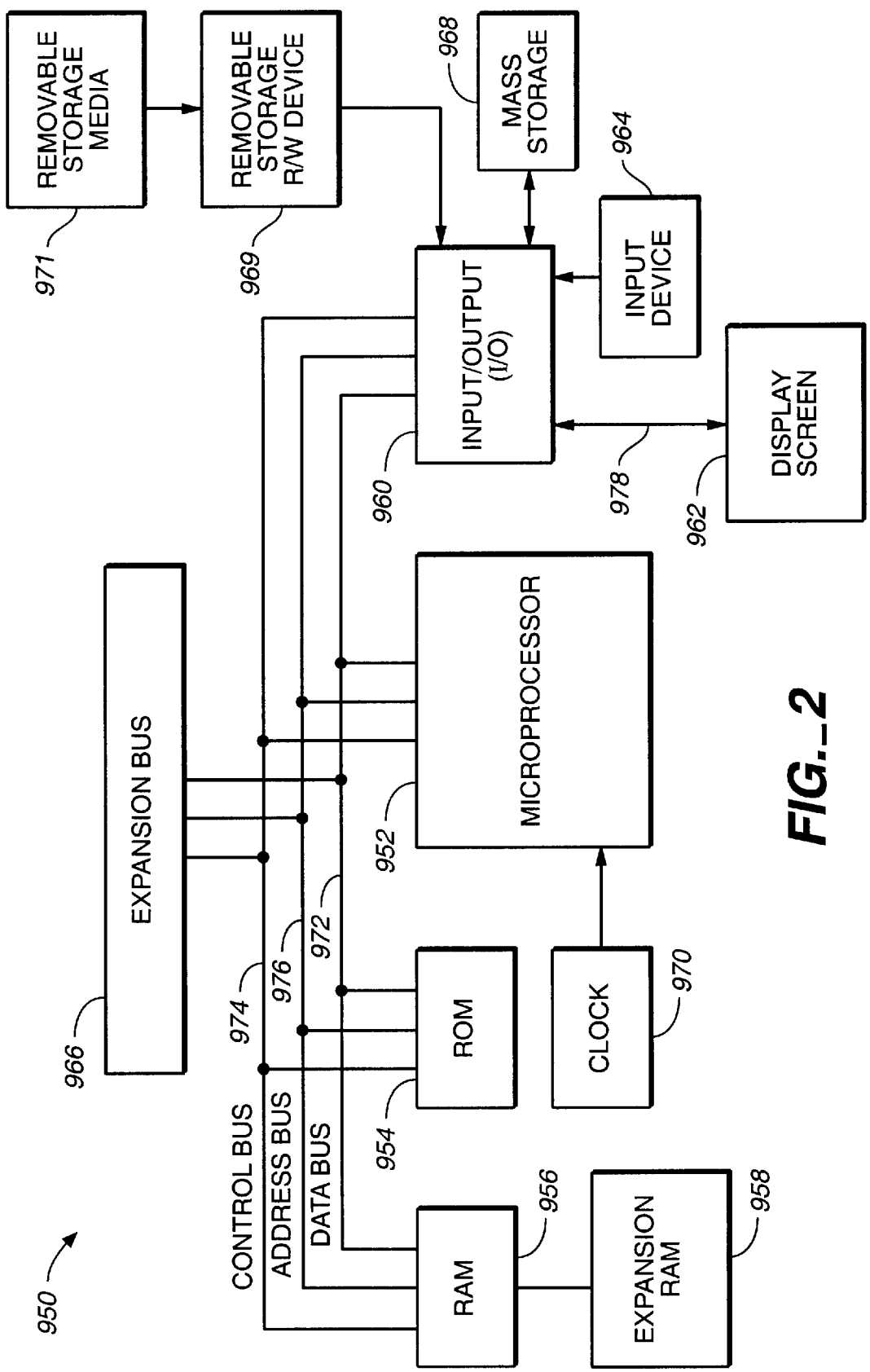
FIG._2

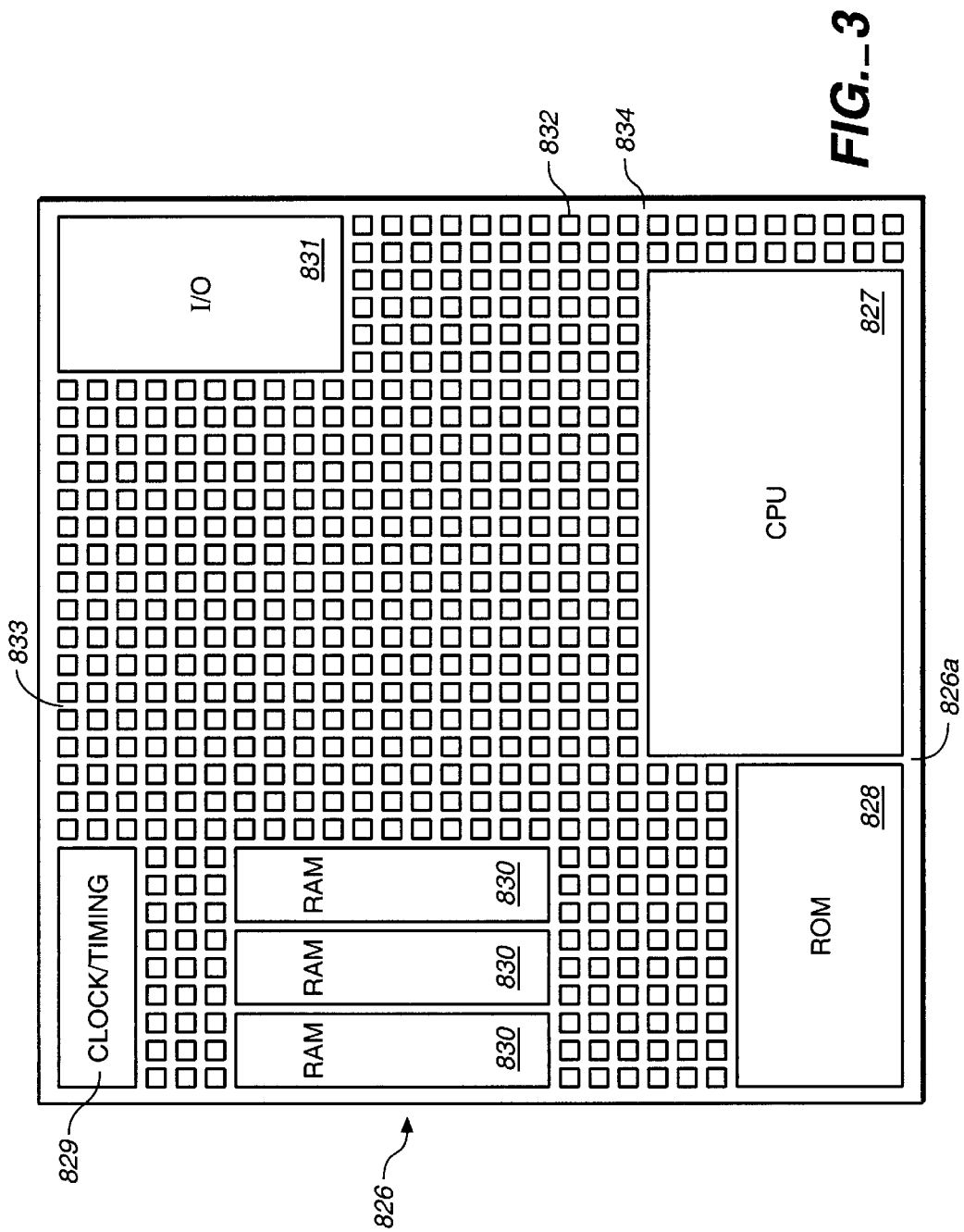
FIG._3

METHOD AND APPARATUS FOR MINIMIZATION OF NET DELAY BY OPTIMAL BUFFER INSERTION

BACKGROUND OF THE INVENTION

1. Field of the Invention

This invention relates to a method of analyzing and optimizing design of integrated circuit (IC) designs. In particular, the present invention relates to a method of minimizing net delay by means of optimal insertion of internal library buffers into nodes of the net tree.

2. Description of the Related Art

An integrated circuit chip (hereafter referred to as an "IC" or a "chip") comprises cells and connections between the cells formed on a surface of a semiconductor substrate. The IC may include a large number of cells and require complex connections between the cells.

A cell is a group of one or more circuit elements such as transistors, capacitors, and other basic circuit elements grouped to perform a function. Each of the cells of an IC may have one or more pins, each of which, in turn, may be connected to one or more other pins of the IC by wires. The wires connecting the pins of the IC are also formed on the surface of the chip.

A net is a set of two or more pins which must be connected, thus connecting the logic circuits having the pins. Because a typical chip has thousands, tens of thousands, or hundreds of thousands of pins, that must be connected in various combinations, the chip also includes definitions of thousands, tens of thousands, or hundreds of thousands of nets, or sets of pins. The number of the nets for a chip is typically in the same order as the order of the number of cells on that chip. Commonly, a majority of the nets include only two pins to be connected; however, many nets comprise three or more pins.

SUMMARY OF THE INVENTION

The present invention involves a method for reducing delay of a net. The method includes constructing a time-space grid, said time-space grid corresponding to a net, passing a wave through the time-space grid, said wave having a wave value, and inserting a buffer at a point on said time-space grid where insertion of the buffer increases a wave value. The buffer can be a negative buffer or positive buffer. Generally, a second wave is passed through the time-space grid simultaneously with the first wave. Typically, the second wave and the first wave are inverted.

BRIEF DESCRIPTION OF THE DRAWINGS

FIG. 1 sets forth a flow chart illustrating the main steps of the present invention.

FIG. 2 is an illustration of a general purpose computer system, representing one of many suitable computer platforms for implementing the inventive IC design optimization methods described herein.

FIG. 3 is an exemplary integrated circuit chip.

DESCRIPTION OF THE PREFERRED EMBODIMENTS

Let a net N be given by the tree T that spans all the pins of the net (for instance, it might be a Steiner tree) and the root of the tree is a driver of the net. For all other net pins (which are input pins of cells), departure times and loads are also defined. The purpose of the present invention is to minimize delay of the net by means of optimal insertion of internal buffers into the net tree in order to strengthen the signal in the net and thus to minimize the delay. These library buffers can be positive buffers (which perform identical function x) as well as negative ones (which perform a negation function $\overline{X}$).

The primary concept underlying the present invention is a discretization of the space-time and discrete approximation of the optimizing "wave" spreading along the tree T in the backwards direction from its leaves (i.e., input pins of the net) towards its root (i.e., the driver of the net).

More specifically, we first divide the edges of the tree T by auxiliary nodes so that the distance between two consecutive nodes is smaller than some given value $d_x$. The step of edge partition $d_x$ is a parameter of the algorithm and may be varied, for instance, in the range of 10–100 microns. The set of all nodes of the tree together with all constructed auxiliary nodes we denote by $T_{d_x}$. This set forms a partition of the space. Elements of the set $T_{d_x}$ we call points. We enumerate all points in the topological order so that we can put $T_{d_x} = \{0, 1, \ldots, \text{pointindexrange}-1\}$. This topological numbering can be done by well-known methods. Such methods are described in U.S. patent application Ser. No. 09/626,037, which is incorporated herein by this reference as though set forth in full.

We also define the orientation of the edges of the tree. The closest to the tree root (in tree metric) endpoint of the edge we call beginning of the edge and the other endpoint we call its ending. In topological numbering ending of any edge is assigned a number that is smaller than the corresponding number of edge beginning.

For every edge of the tree T we determine its level as a maximal number of edges in oriented chain that goes from a net input to the root. Such a partition of all edges of the tree into the levels can be constructed quite analogously to the topological numbering of all nodes of the tree.

Our algorithm works with the list L of all tree edges by processing edges from the same level and so repeats level by level. Edges from the same level are processed independently so the method can be parallelized. While processing the edges, the algorithm produces an optimizing "wave", which goes through all tree nodes moving back from the ending of an edge toward its beginning.

Every node n of the tree T is presented in the list L deg(n) times, where deg(n) is the degree of the node n in the tree T. Moreover, the node n is presented in L deg(n)−1 times as the beginning of certain edges and only once as the ending of the corresponding edge. For the root of the tree we agree that it is also the ending of a dummy edge. Therefore, we include to the set $T_{d_x}$ nodes from the tree T together with its copies. We did so when we counted them.

Thus, all nodes (and its copies) of the tree T from the edge list together with auxiliary nodes from edges partitionings (according to the step $d_x$) can be divided into the following three groups:

1. input nodes (or points), i.e. input pins of the net;
2. transition nodes (or points), i.e. edge beginnings together with all auxiliary nodes;
3. junction nodes (or points), i.e. the root and edge endings (excluding input nodes).

Secondly, we take also into consideration step dt of time partition. This step is chosen small enough in order to distinguish buffer delays. For example, $d_t$ can be taken equal to 0.1 of the minimal delay of the "fastest" buffer from the cell library, computed with zero load on output pin of the buffer. On the other hand, we choose time interval 1 to be large enough to pass freely the optimizing wave through the interval. The interval 1 is divided into time segments according to the chosen step $d_t$. We do not distinguish time values from the same time segment. In other words, step $d_t$ appears to be the error in our measurement of time. So, we measure time discretely—0, $d_t$, $2d_t$, . . . Note that zero moment of time here corresponds to (synchronized with) the minimal value of the departure time among all departure times of input nodes of the net N. We denote it by mindeparturetime.

We enumerate in a row time segments and denote the set of its numbers by $I_{d_t}$:

$$I_{d_t} = \{0, 1, \ldots, \text{timeindexrange} -1\}.$$

Therefore, we constructed the time-space grid $G = T_{d_x} \times I_{d_t}$ along which the optimizing wave V will be spread. In fact, we have two interacting (or dual) families of waves $V^0$ and $V^1$, which spread along the grid G. Waves from $V^0$ correspond to the correct signal passing through the net and waves from $V^1$ correspond to the inverting signal (which must be inverted somewhere in the net tree once more).

For cell delay computation we use extern function Cell-Delay. For a given cell type ct and for its output pin $P_1$, for a given load I and for an input pin $p_0$ of the cell, we compute delay d of the signal in a following way, d=CellDelay(ct, $p_1$, $p_0$, I). And also there is one more extern function PinCapacitance(ct,$p_0$), which returns a capacitance of the input pin $p_0$ of the cell ct.

Going further, for the point $p \in T_{d_x}$ and for the time-index $i \in I_{d_t}$, we denote by $V_p^0[i]$ the load of the subnet obtained if a driver were located in the point p. Let for example $V_p^0[i]=I$ and an internal buffer of the type ct has been just inserted to the point p. Then departure time for the input pin $p_0$ of the buffer can be recomputed (with the time error $d_t$) as $$\text{mindeparturetime} + i \cdot d_t + \text{CellDelay}(ct, p_1, p_0, I).$$

In addition, we associate with the point (p,i) of the grid G a reference vector $R_p^0[i]$ =(celltype, timeindex). Positive value of celltype in the reference vector means that internal buffer of the type celltype is inserted to the point p. Value of timeindex indicated that current value of the wave $V_p^0$ was improved (or optimized) from the grid point (p, timeindex) of the same wave (or of the dual wave $V_p^1$ for inverted signal). Note that several buffers in a row can be inserted to a point (some of them might be negative ones as well). The value celltype=−1 indicated that there are no buffers inserted to the point. It is important to note that the wave $V_p^0$ (and $V_p^1$) appear to be a monotone function as a function of the time argument i, i.e. value $V_p^0[i]$ is monotonically decreasing to some value (and then remains constant), when time index is increasing. Let us denote by $m^0$ [p] the minimal value of time index for which the wave value $V_p^0[i]$ is defined in the point p and denote by $M^0[p]$ the value of time index for which the wave value $V_p^0[i]$ is already stable. These two indices appear to be bounds of the wave front in the point p. In the beginning we put $M^0[p]=-1$ and this means absence of the wave in the point p. During the movement of the waves along edges of the tree (i.e. in the process of optimization) in every point we recompute waves values between time indexes $m^0[p]$ and $M^0[p]$ and recompute waves bounds as well, i.e. values $m^0[p]$ and $M^0[p]$ themselves.

For the inverted waves $V^1$ we use all the same notions and definitions introduced above, but using superscript 1 instead of 0 only.

During waves $V^0$ and $V^1$ movement along points we perform waves initialization in input points. Then, in transition points, we add to waves values load of corresponding piece of wire of the length dx (or maybe less). And finally, in points of junction, we summarize corresponding waves together under condition that undefined value on summation of at least one of the them makes all the sum undefined. And also we recompute bounds of the wave fronts if it is needed.

A key procedure of our method is the optimization of waves, which is performed in every point immediately when the wave appears in the point. Optimization in the point p consists of positive or negative buffer insertion into the point p while it increases some of the wave values, $V_p^0[i]$ or $V_p^1[i]$. In order to speed up computation, the whole procedure might be applied only while wave values increase for the time index i being less than timeindexlimit, where timeindexlimits is some predefined parameter of the algorithm (it might be also chosen depending on the point).

It is natural that insertion of the negative buffer affects dual wave and insertion of the positive buffer affects the current wave in the point. We record buffer insertions by means of reference vectors $R_p^0$ and $R_p^0$. When waves reach the root r of the tree (i.e. driver of the given net N) and after optimization was performed in it, we find in the wave $V_r^0$ an index $i_{opt}$ such that $m_r^0 \leq i_{opt} \leq M_r^0$ and for which the value $$D[i] = \text{mindeparturetime} + i \cdot d_t + \max_{p0}(\text{CellDelay}(ct, p_1, p_0, V_r^0[i]))$$

takes the minimal value $D_{opt}$. When having obtained the time index $i_{opt}$, we begin a backward movement along the tree from the root to input pins. Starting from the value $V_r^0[i_{opt}]$ and using reference vectors in order to move backwards, we easily find buffer placement in the points of the net tree that give us minimal delay of the net N under given circumstances.

The main steps of the present invention described in the flowchart set forth on FIG. 1.

A. Initializing Procedure, Wave Transition and Junction

Let p be an input pin for which load 1, departure time d, and inversion flag f are given. Flag f designates that in the point p we need either net signal (if f=0) or its inversion (if f=1). We find time index $$i_0 = \left[ \frac{d - \min departuretime}{d_i} \right]$$

and we put $V_p^f[i_0]=d,=d,m^f[p]=i_0$ and $M^f[p]=i_0$. Reference vectors and also dual wave in the initial point p remain unspecified. Let now p be a transition point and q be a neighboring point for which both waves $V_q^0$ and $V_q^0$ have been previously defined. Recall that we traverse points in the topological q order, Let 1 be a load of the piece of wire between points p and q. Not changing the bounds of the waves, we put inside corresponding wave bounds $V_p^0[i] = V_q^0[i]+I$ and $V_p^1[i]=V_q^1[i]+I$, respectively.

Let finally p be a junction point. Note that p is a branching node in the tree T. Let $p_1, p_2, \ldots, p_s$, where s=deg(p), all be beginnings of edges and all of them appear to be copies of the point p. For waves $V_{p1}^0, V_{p2}^0 \ldots, V_{ps}^0$, we find first new wave bounds inside which there must exist all of indicated above waves. Then we sum up inside so obtained wave bounds, $V_p^0[i] = V_{p1}^0[i] + V_{p1}^0[i] + \ldots + V_p^0[i]$. We proceed with dual waves similarly.

B. Optimization Procedure

The optimization step of the present invention is performed in every point as soon as the point has been reached by waves. For buffers from the list of available library internal buffers we consequently insert them into the point p while at least one value of either wave $V_p^0$ or $V_p^1$ can be increased. In addition, insertion of a negative buffer optimizes the dual wave and at that time a positive buffer insertion does the current wave.

Let us describe for example how we optimize the wave $V_p^0$ on inserting to the point p a positive buffer but of the type ct. Let input pin of the buffer buf has number 1 and its output pin has number 0. For every time index i within wave bounds, i.e. for i such that $m_p^0 \leq i \leq M_p^0$, we compute first a delay d of the buffer d=CellDelay(ct, $p_1$, $p_0$, $V_p^0[i]$, capacitance I, I=PinCapacitance(ct, I), and time index $$k, k = i + \left[\frac{d}{d_i}\right].$$

Note, that in the case k>timeindexlimit further optimization for the current buffer can be canceled at this moment.

Let us denote by M, M=M$^0$[p], the right bound of the wave $V_p^0$ here are two possibilities:
1. k≦M. In this case for all j such that k≦j≦M if $V_p^0[j]$>I (or $V_p^0[j]$ is not defined, such a case might happen if a negative buffer insertion optimizes a dual wave) we put $V_p^0[j]$=1 . In addition, if $V_p^0[M] \geq 1$ I we shift to the left the right bound of the wave front and put M$^0$[p]=k (it should be noted here that in the case of negative buffer insertion if k<m$^0$[p] holds true then we have to shift the left bound as well, m$^0$ [p]=k);
2. k>M. Denote L=$V_p^0$[M]. If L>I then for all j such that M≦j ≦k we put $V_p^0[j]$=L. Next we have $V_p^0[k]$=I and right bound is shifted furher to the right, M$^0$[p]=k.

If in either cases 1 or 2 for the time index j we increase indeed the value of the wave $V_p^0[j]$, then we store the corresponding reference and put $R_p^0[j]$=(ct,i) as far as the optimization happened from the grid point (p,i) by means of buffer but of the type ct insertion to the point p.

C. Backward Reference

The procedure of references processing is recursive and it starts from the root r and time index $i_{opt}$. The purpose of this invention is to create a method to minimize net delay by means of optimal insertion of internal library buffers into nodes of the net tree. For the wave value $V_p^f[j]$, where f=o or f=1, we use reference vectors $R_p^f[j]$=(ct,i) to read and to store buffer insertion to the point p. If ct≧0, we go to the grid point (p,i) and continue the procedure while ct≧0. In addition, if buffer of the type ct is negative one we change the current wave to the dual one. Otherwise, if ct=−1, then we go to the neighboring point q and repeat the whole procedure for the current wave in the grid point (q,i).

During the work of the procedure we store points and buffers in the order of its reading. This information generates buffer placement in the net N. It is clear that when steps of approximation $d_x$ and $d_t$ are set small enough then our algorithm finds buffer placement with optimal delay of the net.

D. Apparatus for Performing Present Invention

FIG. 2 is an illustration of a general purpose computer system, representing one of many suitable computer platforms for implementing the inventive IC design optimization methods described above. FIG. 2 shows a general purpose computer system 950 in accordance with the present invention includes a central processing unit (CPU) 952, read only memory (ROM) 954, random access memory (RAM) 956, expansion RAM 958, input/output (I/O) circuitry 960, display assembly 962, input device 964, and expansion bus 966. Computer system 950 may also optionally include a mass storage unit 968 such as a disk drive unit or nonvolatile memory such as flash memory and a real-time clock 970.

CPU 952 is coupled to ROM 954 by a data bus 972, control bus 974, and address bus 976. ROM 954 contains the basic operating system for the computer system 950. CPU 952 is also connected to RAM 956 by busses 972, 974, and 976. Expansion RAM 958 is optionally coupled to RAM 956 for use by CPU 952. CPU 952 is also coupled to the I/O circuitry 960 by data bus 972, control bus 974, and address bus 976 to permit data transfers with peripheral devices.

I/O circuitry 960 typically includes a number of latches, registers and direct memory access (DMA) controllers. The purpose of I/O circuitry 960 is to provide an interface between CPU 952 and such peripheral devices as display assembly 962, input device 964, and mass storage 968.

Display assembly 962 of computer system 950 is an output device coupled to I/O circuitry 960 by a data bus 978. Display assembly 962 receives data from I/O circuitry 960 via bus 978 and displays that data on a suitable screen.

The screen for display assembly 962 can be a device that uses a cathode-ray tube (CRT), liquid crystal display (LCD), or the like, of the types commercially available from a variety of manufacturers. Input device 964 can be a keyboard, a mouse, a stylus working in cooperation with a position-sensing display, or the like. The aforementioned input devices are available from a variety of vendors and are well known in the art.

Some type of mass storage 968 is generally considered desirable. However, mass storage 968 can be eliminated by providing a sufficient mount of RAM 956 and expansion RAM 958 to store user application programs and data. In that case, RAMs 956 and 958 can optionally be provided with a backup battery to prevent the loss of data even when computer system 950 is turned off. However, it is generally desirable to have some type of long term mass storage 968 such as a commercially available hard disk drive, nonvolatile memory such as flash memory, battery backed RAM, PC-data cards, or the like.

A removable storage read/write device 969 may be coupled to I/O circuitry 960 to read from and to write to a removable storage media 971. Removable storage media 971 may represent, for example, a magnetic disk, a magnetic tape, an opto-magnetic disk, an optical disk, or the like. Instructions for implementing the inventive method may be provided, in one embodiment, to a network via such a removable storage media.

In operation, information is inputted into the computer system 950 by typing on a keyboard, manipulating a mouse or trackball, or "writing" on a tablet or on position-sensing screen of display assembly 962. CPU 952 then processes the data under control of an operating system and an application program stored in ROM 954 and/or RAM 956. CPU 952 then typically produces data which is outputted to the display assembly 962 to produce appropriate images on its screen.

Expansion bus 966 is coupled to data bus 972, control bus 974, and address bus 976. Expansion bus 966 provides extra ports to couple devices such as network interface circuits, modems, display switches, microphones, speakers, etc. to CPU 952. Network communication is accomplished through the network interface circuit and an appropriate network.

Suitable computers for use in implementing the present invention may be obtained from various vendors. Various computers, however, may be used depending upon the size and complexity of the optimization tasks. Suitable computers include mainframe computers, multiprocessor computers, workstations, or personal computers.

It should be understood that the present invention also relates to machine readable media on which are stored program instructions for performing methods of this invention. Such media includes, by way of example, magnetic disks, magnetic tape, optically readable media such as CD ROMs, DVD, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

E. Fabrication of Optimized ICs

After the initial circuit description is optimized as discussed above, additional steps must be taken to complete the manufacture of the IC. These additional steps are very well known by those skilled in the art of semiconductor fabrication and are briefly described below.

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design.

Currently, the minimum geometric feature size of a component is on the order of 0.2 microns. However, it is expected that the feature size can be reduced to 0.1 micron within the next few years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality.

An exemplary integrated circuit chip is illustrated in FIG. 3 and generally designated by the reference numeral 826. The circuit 826 includes a semiconductor substrate 826A on which are formed a number of functional circuit blocks that can have different sizes and shapes. Some are relatively large, such as a central processing unit (CPU) 827, a read-only memory (ROM) 828, a clock/timing unit 829, one or more random access memories (RAM) 830 and an input/output (I/O) interface unit 831. These blocks, commonly known as macroblocks, can be considered as modules for use in various circuit designs, and are represented as standard designs in circuit libraries.

The integrated circuit 826 further comprises a large number, which can be tens of thousands, hundreds of thousands or even millions or more of small cells 832. Each cell 832 represents a single logic element, such as a gate, or several logic elements interconnected in a standardized manner to perform a specific function. Cells that consist of two or more interconnected gates or logic elements are also available as standard modules in circuit libraries.

The cells 832 and the other elements of the circuit 826 described above are interconnected or routed in accordance with the logical design of the circuit to provide the desired functionality. Although not visible in the drawing, the various elements of the circuit 826 are interconnected by electrically conductive lines or traces that are routed, for example, through vertical channels 833 and horizontal channels 834 that run between the cells 832.

The input to the physical design problem is a circuit diagram, and the output is the layout of the circuit. This is accomplished in several stages including partitioning, floor planning, placement, routing and compaction.

Partitioning. A chip may contain several million transistors. Layout of the entire circuit cannot be handled due to the limitation of memory space as well as the computation power available. Therefore it is normally partitioned by grouping the components into blocks such as subcircuits and modules. The actual partitioning process considers many factors such as the size of the blocks, number of blocks and number of interconnections between the blocks.

The output of partitioning is a set of blocks, along with the interconnections required between blocks. The set of interconnections required is the netlist. In large circuits, the partitioning process is often hierarchical, although non-hierarchical (e.g. flat) processes can be used, and at the topmost level a circuit can have between 5 to 25 blocks. However, greater numbers of blocks are possible and contemplated. Each block is then partitioned recursively into smaller blocks.

Floor planning and placement. This step is concerned with selecting good layout alternatives for each block of the entire chip, as well as between blocks and to the edges. Floor planning is a critical step as it sets up the ground work for a good layout. During placement, the blocks are exactly positioned on the chip. The goal of placement is to find a minimum area arrangement for the blocks that allows completion of interconnections between the blocks. Placement is typically done in two phases. In the first phase, an initial placement is created. In the second phase, the initial placement is evaluated and iterative improvements are made until the layout has minimum area and conforms to design specifications.

Routing. The objective of the routing phase is to complete the interconnections between blocks according to the specified netlist. First, the space not occupied by blocks, which is called the routing space, is partitioned into rectangular regions called channels and switch boxes. The goal of a router is to complete all circuit connections using the shortest possible wire length and using only the channel and switch boxes.

Routing is usually done in two phases referred to as the global routing and detailed routing phases. In global routing, connections are completed between the proper blocks of the circuit disregarding the exact geometric details of each wire and terminal. For each wire, a global router finds a list of channels that are to be used as a passageway for that wire. In other words, global routing specifies the loose route of a wire through different regions of the routing space.

Global routing is followed by detailed routing which completes point-to-point connections between terminals on the blocks. Loose routing is converted into exact routing by specifying the geometric information such as width of wires and their layer assignments. Detailed routing includes channel routing and switch box routing.

Compaction. Compaction is the task of compressing the layout in all directions such that the total area is reduced. By making the chips smaller, wire lengths are reduced which in turn reduces the signal delay between components of the circuit. At the same time a smaller area enables more chips to be produced on a wafer which in turn reduces the cost of manufacturing. Compaction must ensure that no rules regarding the design and fabrication process are violated.

Wafer Construction. Photolithography is a common technique employed in the manufacture of semiconductor devices. Typically, a semiconductor wafer is coated with a layer (film) of light-sensitive material, such as photoresist. Using a patterned mask or reticle, the wafer is exposed to projected light, typically actinic light, which manifests a photochemical effect on the photoresist, which is subsequently chemically etched, leaving a pattern of photoresist "lines" on the wafer corresponding to the pattern on the mask.

A "wafer" is a thin piece of semiconductor material from which semiconductor chips are made. The four basic operations utilized to fabricate wafers include (1) layering, (2) patterning, (3) doping and (4) heat treatments.

The layering operation adds thin layers of material, including insulators, semiconductors, and conductors, to a wafer surface. During the layering operation, layers are either grown or deposited. Oxidation involves growing a silicon dioxide (an insulator) layer on a silicon wafer. Deposition techniques include, for example, chemical vapor deposition, evaporation, and sputtering. Semiconductors are generally deposited by chemical vapor deposition, while conductors are generally deposited with evaporation or sputtering.

Patterning involves the removal of selected portions of surface layers. After material is removed, the wafer surface has a pattern. The material removed may form a hole or an island. The process of patterning is also known to those skilled in the relevant art as microlithography, photolithography, photomasking and masking. The patterning operation serves to create parts of the semiconductor device on the wafer surface in the dimensions required by the circuit design and to locate the parts in their proper location on the wafer surface.

Doping involves implanting dopants in the surface of the wafer through openings in the layers to create the n-type and p-type pockets needed to form the N-P junctions for operation of discrete elements such as transistors and diodes. Doping is generally achieved with thermal diffusion (wafer is heated and exposed to the desired dopant) and ion implantation (dopant atoms are ionized, accelerated to high velocities and implanted into the wafer surface).

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiment shown in the drawings and described in detail hereinabove. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. §112¶6.

What is claimed is:

1. A method for reducing delay of a net, said method comprising:
   a. constructing a time-space grid, said time-space grid corresponding to a net, wherein said time-space grid has an axis indicating distance between points in the net and an axis indicating progression of time;
   b. passing a wave through the time-space grid, said wave having wave values that represent load; and
   c. as the wave is passed through the time-space grid, inserting a buffer at a point in the net where insertion of the buffer increases at least one of the wave values on said time-space grid.

2. The method of claim 1 wherein the buffer is a negative buffer.

3. The method of claim 1 wherein a second wave is passed through the time-space grid simultaneously with the first wave.

4. The method of claim 3 wherein said second wave and the first wave are inverted.

5. The method of claim 1 wherein the wave value at any specified point represents subnet load if a driver were located at said specified point.

6. A system for reducing delay of a net, said system comprising:
   a. means for constructing a time-space grid, said time-space grid corresponding to a net, wherein said time-space grid has an axis indicating distance between points in the net and an axis indicating progression of time;
   b. means for passing a wave through the time-space grid, said wave having wave values that represent load; and
   c. means for, as the wave is passed through the time-space grid, inserting a buffer at a point in the net where insertion of the buffer increases at least one of the wave values on said time-space grid.

7. The system of claim 5 wherein the buffer is a negative buffer.

8. The system of claim 5 further computing means for passing a second wave through the time-space grid simultaneously with the first wave.

9. The system of claim 8 wherein said second wave and the first wave are inverted.

10. The system of claim 6 wherein the wave value at any specified point represents subnet load if a driver were located at said specified point.

11. A computer-readable medium storing computer-executable process steps for reducing delay of a net, said process steps comprising:
    a. constructing a time-space grid, said time-space grid corresponding to a net, wherein said time-space grid has an axis indicating distance between points in the net and an axis indicating progression of time;
    b. passing a wave through the time-space grid, said wave having wave values that represent load; and
    c. as the wave is passed through the time-space grid, inserting a buffer at a point in the net where insertion of the buffer increases at least one of the wave values on said time-space grid.

12. The computer-readable medium of claim 11 wherein the buffer is a negative buffer.

13. The computer-readable medium of claim 11 wherein a second wave is passed through the time-space grid simultaneously with the first wave.

14. The computer-readable medium of claim 11 wherein said second wave and the first wave are inverted.

15. The computer-readable medium of claim 11 wherein the wave value at any specified point represents subnet load if a driver were located at said specified point.

* * * * *